(12) United States Patent
Ferdous et al.

(10) Patent No.: US 12,362,002 B2
(45) Date of Patent: Jul. 15, 2025

(54) STAGGERED READ RECOVERY FOR IMPROVED READ WINDOW BUDGET IN A THREE DIMENSIONAL (3D) NAND MEMORY ARRAY

(71) Applicant: Intel NDTM US LLC, Santa Clara, CA (US)

(72) Inventors: Rifat Ferdous, Lafayette, IN (US);
Sung-Taeg Kang, Palo Alto, CA (US);
Rohit S. Shenoy, Fremont, CA (US);
Ali Khakifirooz, Brookline, MA (US);
Dipanjan Basu, Portland, OR (US)

(73) Assignee: Intel NDTM US LLC, Santa Clara, CA (US)

( * ) Notice: Subject to any disclaimer, the term of this patent is extended or adjusted under 35 U.S.C. 154(b) by 821 days.

(21) Appl. No.: 17/322,724

(22) Filed: May 17, 2021

(65) Prior Publication Data

US 2022/0366962 A1 Nov. 17, 2022

(51) Int. Cl.
| | | |
|---|---|---|
| *G11C 16/08* | (2006.01) |
| *G11C 7/04* | (2006.01) |
| *G11C 11/4074* | (2006.01) |
| *G11C 11/408* | (2006.01) |
| *G11C 11/409* | (2006.01) |
| *G11C 16/04* | (2006.01) |
| *G11C 16/32* | (2006.01) |

(52) U.S. Cl.
CPC ............ *G11C 11/4085* (2013.01); *G11C 7/04* (2013.01); *G11C 11/4074* (2013.01); *G11C 11/409* (2013.01); *G11C 16/0483* (2013.01); *G11C 16/08* (2013.01); *G11C 16/32* (2013.01)

(58) Field of Classification Search
CPC ... G11C 11/4085; G11C 7/04; G11C 11/4074; G11C 11/409; G11C 16/08; G11C 16/32; G11C 16/0483; G11C 16/3418; G11C 11/5642; G11C 16/26
See application file for complete search history.

(56) References Cited

U.S. PATENT DOCUMENTS

| | | | |
|---|---|---|---|
| 6,493,261 B1 * | 12/2002 | Hamilton | G11C 16/0475 365/185.11 |
| 8,670,285 B2 | 3/2014 | Dong et al. | |
| 9,047,973 B2 | 6/2015 | Costa et al. | |
| 9,349,478 B2 | 5/2016 | Yuan et al. | |
| 2006/0245251 A1 * | 11/2006 | Shirota | G11C 16/0483 365/185.17 |
| 2011/0267890 A1 | 11/2011 | Fujiu | |

(Continued)

*Primary Examiner* — Jay W. Radke
(74) *Attorney, Agent, or Firm* — Morgan, Lewis & Bockius LLP

(57) ABSTRACT

At the end of or after a reading operation in a 3D (three dimensional) NAND array, the wordlines of the 3D NAND array can be transitioned to ground in a staggered manner. The 3D NAND array includes a 3D stack with multiple wordlines vertically stacked, including a bottom-most wordline, a top-most wordline, and middle wordlines between the bottom-most wordline and the top-most wordline. A controller that controls the reading can set the multiple wordlines to a high voltage at the end or after the reading operation and then transition a selected wordline of the multiple wordlines from the high voltage to ground prior to transitioning the other wordlines to ground. Thus, the controller will transition the other wordlines from the high voltage to ground after a delay.

16 Claims, 10 Drawing Sheets

(56) References Cited

U.S. PATENT DOCUMENTS

| | | | |
|---|---|---|---|
| 2015/0003169 A1* | 1/2015 | Nam | G11C 11/5628 365/185.25 |
| 2015/0063037 A1* | 3/2015 | Lee | G11C 16/0483 365/185.24 |
| 2015/0179271 A1* | 6/2015 | Nam | G11C 16/16 365/218 |
| 2015/0318045 A1* | 11/2015 | Yun | G11C 16/30 365/185.25 |
| 2016/0189786 A1* | 6/2016 | Sakai | G11C 16/26 365/185.03 |
| 2016/0247578 A1* | 8/2016 | Yun | G11C 16/3418 |
| 2016/0260489 A1* | 9/2016 | Lee | G11C 16/3427 |
| 2018/0053554 A1* | 2/2018 | Nam | G11C 16/28 |
| 2018/0137925 A1* | 5/2018 | Nam | G11C 16/28 |
| 2019/0378581 A1* | 12/2019 | Zhao | G11C 16/0483 |
| 2020/0411100 A1* | 12/2020 | Kamae | G06F 3/064 |
| 2021/0020254 A1* | 1/2021 | Kim | G11C 16/26 |
| 2021/0020256 A1* | 1/2021 | Kim | G11C 16/26 |
| 2022/0130467 A1* | 4/2022 | Yu | G11C 16/26 |
| 2022/0208246 A1* | 6/2022 | Choi | G11C 11/4096 |

* cited by examiner

STAGGERED READ RECOVERY FOR IMPROVED READ WINDOW BUDGET IN A THREE DIMENSIONAL (3D) NAND MEMORY ARRAY

FIELD

Descriptions are generally related to NAND memory, and more particular descriptions are related to reading NAND memory.

BACKGROUND

Density scaling on 3D (three dimensional) NAND flash memory devices is desired for higher capacity and lower power devices, but can have performance impacts on access to the media. One particular performance impact is read window budget (RWB) degradation. Both threshold voltage (Vt) shift and cell-to-cell variation cause RWB degradation by widening the Vt distribution across the different cells of the storage array. The Vt distribution can increase due to changes in temperature between write and read operations. Another source of RWB degradation is random telegraph noise, which causes the Vt of the same cell to be different between two successive reads.

The Vt distribution impact can be more significant in 3D NAND arrays than traditional 2D (two dimensional) or planar arrays when the 3D NAND array has polycrystalline vertical channels. The charge traps and grain boundaries in the vertical channel can amplify the distribution spreading, as trapped charges change cell Vt. In a traditional read, all wordlines in the array are taken to a low voltage reference or ground from a pass voltage. The charges in the channel may not fully discharge from the channel when the wordlines are discharged, especially when the array is fully programmed.

Some systems will limit the program step used in programming in an attempt to compensate for RWB loss caused by write-to-read temperature change and read noise. However, there are limits to how much smaller program steps can improve RWB, and the use of the smaller steps increases programming time (tprog). The RWB loss caused by write-to-read temperature change can also be reduced by limiting the operating temperature range of the storage media, which is significantly limiting on use cases and deployment of the media.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
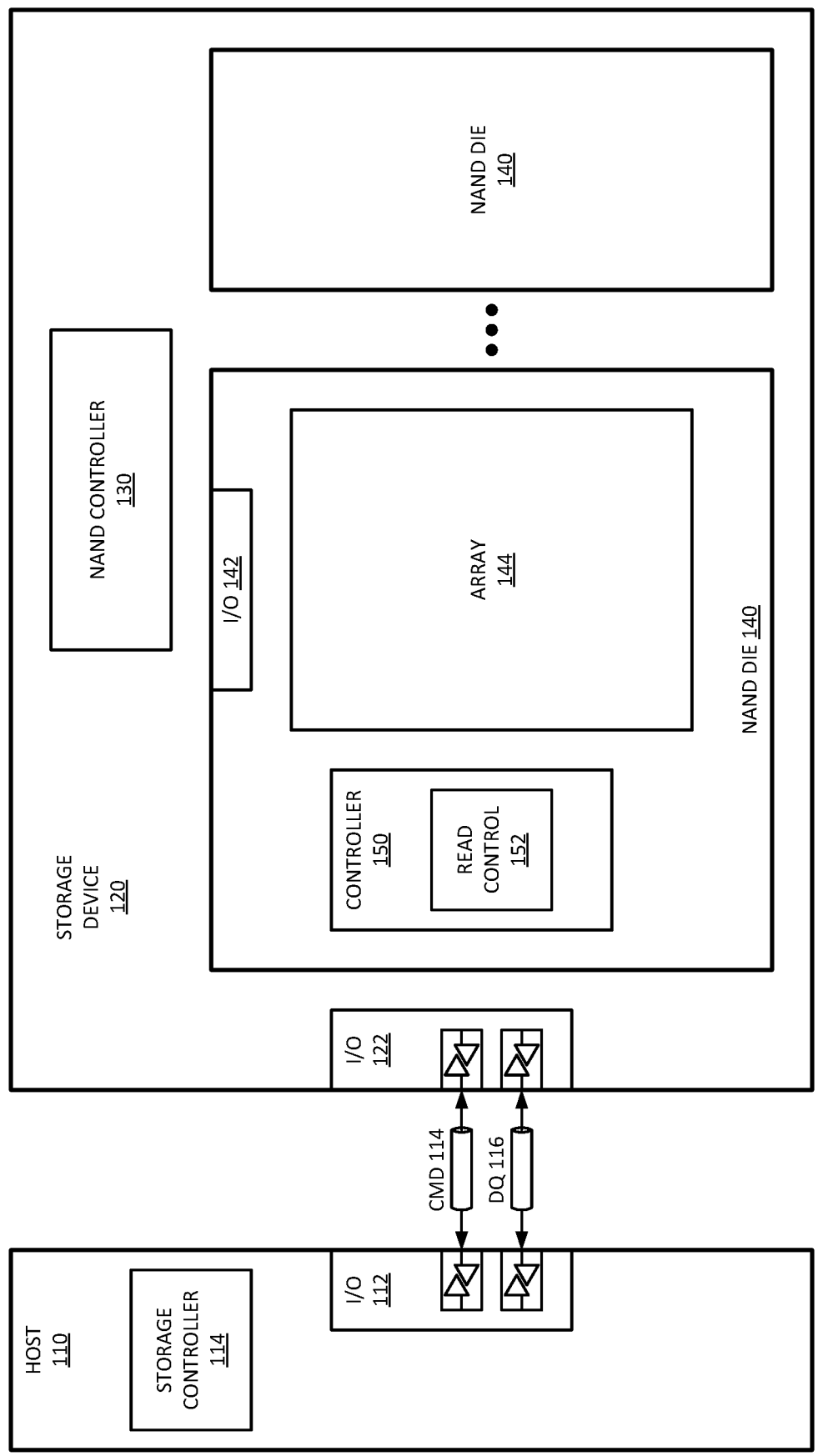
FIG. 1 is a block diagram of an example of a system with a storage device that includes sequential transitions of wordlines from a pass voltage to ground.

Descriptions of certain details and implementations follow, including non-limiting descriptions of the figures, which may depict some or all examples, and well as other potential implementations.

DETAILED DESCRIPTION

As described herein, the wordlines of a 3D (three dimensional) NAND array are transitioned to ground after a read in a staggered manner. The 3D NAND array includes a 3D stack with multiple wordlines vertically stacked, including a bottom-most wordline, a top-most wordline, and middle wordlines between the bottom-most wordline and the top-most wordline. A controller that controls the reading can set the multiple wordlines to at least one read voltage and a pass voltage for reading operations and then transition a selected wordline of the multiple wordlines from the read voltage to ground prior to transitioning the other wordlines to ground. Thus, the controller will transition the other wordlines from the pass voltage to ground after a delay.

After a read operation of a programmed 3D NAND array the media controller sequentially causes the wordlines to go to ground (GND) from the pass voltage. In one example, the wordlines can be sent to ground sequentially from a middle wordline, and propagating toward the top and bottom wordlines in parallel. In one example, the wordlines can be sent to ground sequentially from the top wordline, propagating to the bottom wordline. In one example, the wordlines can be sent to ground sequentially starting from the bottom wordline, propagating to the top wordline.

Whether the sequence of grounding the wordlines is top to bottom, bottom to top, or middle to the ends, when a wordline goes to ground there is an adjacent wordline that is still biased, providing a grounding path for charge. Thus, when one wordline goes to GND, wordlines on one or both side of wordline will be at the pass voltage (e.g., a high voltage bias Vpassr). As a result of the adjacent wordline bias, charges can leave the channel region near the grounded wordline, resulting in reduced trapped charges that enhance temperature sensitivity and read noise.

Therefore, in contrast to traditional read operations of 3D NAND arrays, the excess charges in the channel can be removed to ground. Providing a grounding path reduces or prevents the buildup of charge at the grain boundaries in the channel, but instead can be more fully eliminated from the channel. Improved grounding of charge from the channel can improve read noise and reduce temperature sensitivity, which improves 3D NAND performance and permits continued scaling. Read operation that sequentially grounds the wordlines can reduce RWB (read window budget) degradation caused by read noise and temperature effects.

In one example, the sequential grounding of wordlines is applied selectively. For example, when the difference between write and read temperature is higher than a threshold, the sequential grounding can minimize read time impact while improving RWB. In one example, the controller can selectively apply sequential grounding based on whether a wordline is a critical wordline. A critical wordline can refer to a wordline that suffers most from write-to-read temperature changes. A critical wordline is more sensitive to temperature differences. In one example, the controller allows the critical wordlines to go to ground individually, while other wordlines can go to ground in groups.

It will be understood that reference to sequential wordline grounding can be performed in any number of stages, where one or more wordlines are triggered to go to ground per stage. The more stages used, the more time is allowed for excess charge to discharge from the channel, but the longer the grounding sequence will take. The system can balance the time to ground with the ability to allow charge to escape by having multiple stages, but fewer stages than there are wordlines, or fewer stages than half the number of wordlines. It will be understood that even two, three, or four different ground triggers can significantly improve the ability to discharge the channel.

FIG. 1 is a block diagram of an example of a system with a storage device that includes sequential transitions of wordlines from a pass voltage to ground. System 100 represents a computing device with nonvolatile storage or nonvolatile memory. System 100 includes host 110, which represents a host platform for the computing device. Host 110 includes a host processor (not explicitly shown) that executes a host operating system (OS) to control the operation of system 100.

Host 110 includes I/O (input/output) hardware 112 or I/O 112 to couple to one or more storage devices 120. I/O 112 includes drivers and receivers, signal line interfaces, and other hardware components used to interface with nonvolatile memory. I/O 112 couples to corresponding I/O 122 of storage device 120, which can represent similar hardware components for bidirectional communication between host 110 and storage device 120. While not shown in detail, storage device 120 can include multiple storage dies such as NAND (not AND) dies 140, with I/O 142 that includes similar I/O hardware.

Host 110 includes storage controller 114, which represents logic within host 110 to control access to storage device 120. In one example, storage controller 114 couples to multiple storage devices 120. CMD (command) 116 represents one or more signal lines to enable storage controller 114 to send commands to storage device 120, such as an access command for data stored on the nonvolatile media. DQ[15:0] (data) signal lines to enable the exchange of data between host 110 and storage device 120.

Storage device 120 represents a device that provides nonvolatile storage of data for system 100. Nonvolatile (NV) storage or NV memory (NVM) refers to a memory device that maintains state even when power to the device is interrupted. Memory whose state is indeterminate when power to the device is interrupted is referred to as volatile memory. In one example, storage device 120 represents a device such as a solid state drive (SSD) that includes multiple nonvolatile memory dies. In one example, storage device 120 represents a multichip package that includes multiple NVM dies. In one example, storage device 120 includes multiple NVM dies, represented by NAND dies 140. In one example, each NAND die 140 includes array 144, which represents an array of memory cells.

NAND die 140 includes controller 150, which represents control within the NAND die. Controller 150 can be or include a microcontroller or other control logic to manage the access to array 144. It will be understood that controller 150 on NAND die 140 is different from NAND controller 130, which represents a storage controller for storage device 120. NAND controller 130 can manage the settings and access to multiple NAND dies 140 for a multi-die package or device.

Controller 150 includes read control 152, which represents logic of controller 150 to perform staggered transitioning or sequential transitioning of wordlines (not specifically shown) of array 144. Array 144 represents a 3D NAND array having a 3D vertical stack of wordlines. In one example, read control 152 enables controller 150 to transition a selected wordline of array 144 from a pass voltage (e.g., Vpassr or a read verify voltage) to ground, and delay transitioning of other wordlines of array 144 until a delay period has passed. After the delay, controller 150 can transition one or more other wordlines to ground. The controller can repeat the process of transitioning a selected wordline or selected wordlines to ground and then delaying before transitioning one or more other wordlines to ground, iteratively transitioning the wordlines to ground.

In one example, controller 150 selectively determines whether to apply sequential transitioning. For example, controller 150 can monitor different conditions of storage device 120, such as temperature, and apply sequential grounding only when a temperature threshold is reached. In one example, the temperature threshold is a threshold of difference between device temperature for reads and writes/programming. In one example, controller 150 does not apply sequential transitioning until a threshold capacity of array 144 is programmed. Thus, controller 150 could apply normal transitioning of all wordlines to ground together while the conditions of NAND die 140 are within a threshold range, or when array 144 is not completely programmed. After the threshold or thresholds are reached, controller 150 can apply sequential transitioning of the wordlines to ground.

Figure 2A:
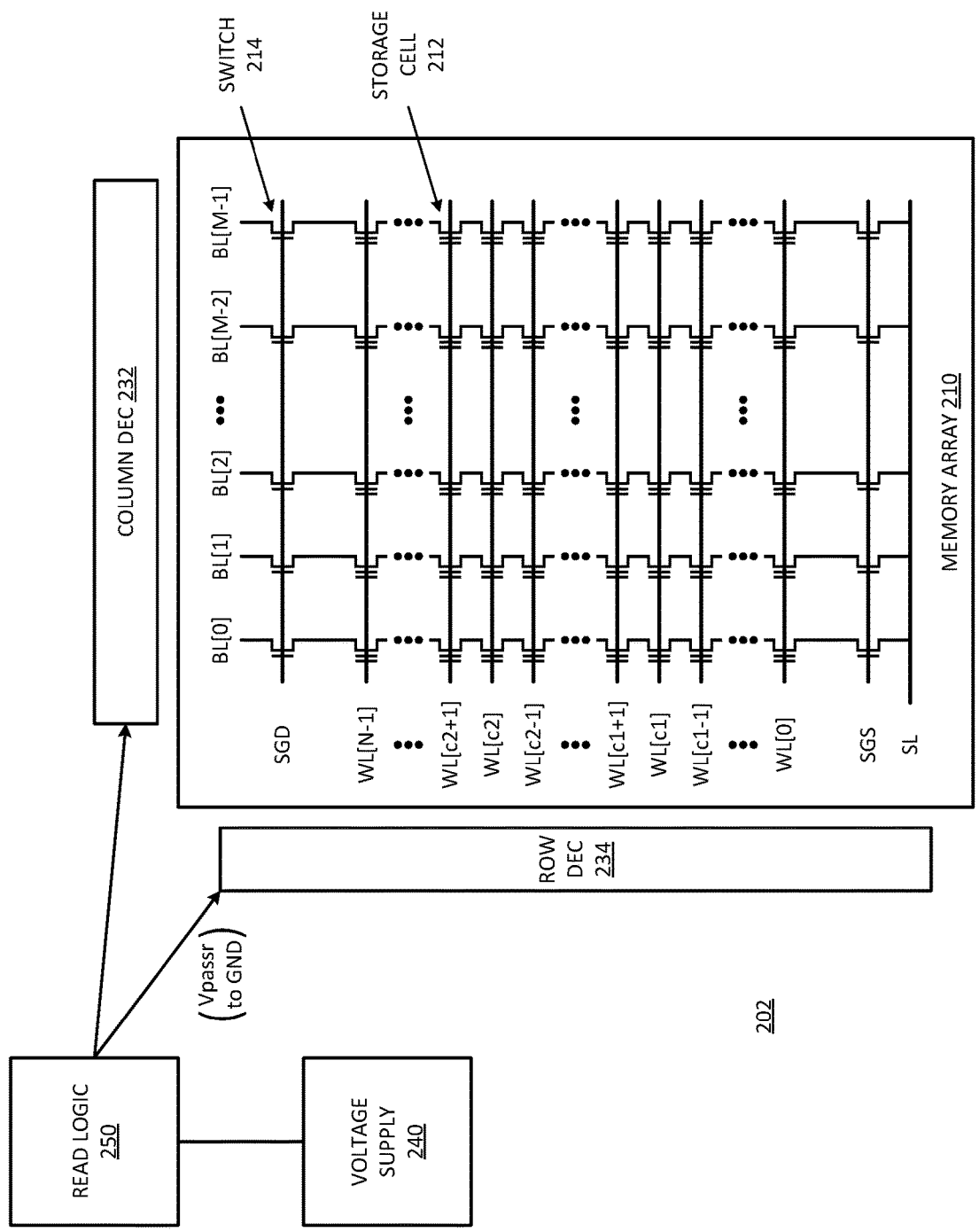
FIG. 2A is a block diagram of an example of a system having a 3D NAND array in which sequential transitions of wordlines from a pass voltage to ground can be performed.

FIG. 2A is a block diagram of an example of a system having a 3D NAND array in which sequential transitions of wordlines from a pass voltage to ground can be performed. System 202 can be or be included in a solid state drive (SSD), such as in system 100. System 202 can be integrated into a computing device.

System 202 includes memory array 210. In one example, memory array 210 represents a 3D NAND storage device, and can be a 3D stacked memory device. In one example, the storage cells 212 represent NAND storage cells for a NAND device. Memory array 210 includes N wordlines (WL[0] to WL[N-1]). N can be, for example, 32, 48, 64, or some other number. In general, the size of memory array 210 and the number of wordlines in the stack can affect the spread of Vt (threshold voltage) due to excess charge build-up in the channel.

Access to the columns, pillars or strings of storage cells 212 can be addressed by row (wordline or WL) address and column (bitline or BL) address, and gated with control gate signals. In one example, memory array 210 is organized as multiple subblocks of cells, which is not explicitly shown. The control gate signals can be referred to as switching signals that provide gating control for a channel. For example, the various pillars can be controlled by select gate drain (SGD) signal lines and select gate source (SGS) signal lines. An SGD signal line selectively couples a column to a bitline (BL). An SGS signal line selectively couples a column to a source line (SL). The source line (SL) can be a source layer of material integrated onto a semiconductor substrate.

Memory array 210 includes M bitlines (BL[0] to BL[M-1]). In one example, each storage cell 212 within memory array 210 is addressed or selected by asserting a wordline and a bitline, in conjunction with enabling the column with the gate select switches 214 (shown only on SGD, but SGS switches can be considered included in the control).

System 202 includes column decode circuitry (column dec) 232 as a column address decoder to determine from a received command which bitline or bitlines to assert for a particular command. Row decode circuitry (row dec) 234 represents a row address decoder to determine from a received command which wordline or wordlines to assert for the command.

System 202 operates based on power received from voltage supply 240. Voltage supply 240 represents one or more voltage sources or voltage levels generated within system 202 to power electronic components of an electronic device, which can include system 202. Voltage supply 240 can generate different voltage levels, either as multiple voltage levels from a single voltage supply, or different voltage levels from different voltage supplies. Voltage supply 240 can generate multiple read voltages and bias voltages.

System 202 includes circuitry to apply different voltage levels to different layers of the column stack. In one example, column decode 232 and row decode 234 provide circuitry to apply the various voltages to the various columns and layers of the stack. System 202 can include other circuitry to apply the voltages to the different signal lines or layers of the stack. For example, system 202 can apply high or low voltage levels to the select lines (e.g., SGS, SGD) or to various WLs, or to a combination of wordlines and select lines. The application of the voltages to the select lines can determine whether the switches are open or closed, thus selectively deselecting (open switches) or selecting (closed switches) the columns. The application of voltage to the WLs can determine whether the individual storage cells 212 receive charge, provide charge, or are shut off from the charge.

In one example, system 202 includes read logic 250 coupled to voltage supply 240. Read logic 250 can provide various levels of read voltage to read data, and then transition the wordlines to ground. In one example, read logic 250 can select between setting all wordlines to ground in parallel. In one example, read logic 250 staggers the transitioning of wordlines to ground or sequentially sets the wordlines to ground in groups of one or more wordlines. Not all groups are the same size. For example, a single wordline or pair of wordlines can be one group, and another group can be multiple wordlines. In one example, all groups of wordlines have multiple wordlines, where the groups are not necessarily all the same size.

In an example where memory array 210 is a NAND array, read logic 250 can be part of a NAND control unit (NCU). In one example, the NCU is implemented in a microcontroller on the NAND storage device such as a solid state drive (SSD). System 202 includes control logic to implement the control of grounding of wordlines after a read, including the timing of the transition of the wordline voltages. The control logic can be or include firmware that controls the ground transitions. One or more parts of the read operation can be implemented in hardware control logic. In general, the control logic is capable to provide control over the timing of different wordlines going to ground after a read.

In one example, system 202 includes an SSD with memory array 210. One or more components of voltage supply 240 can be located outside the SSD, with the other elements of system 202 being within the SSD. In one example, voltage supply 240 refers to elements within and outside of the SSD, with portions of the voltage supply to provide voltage to the SSD, and the SSD including voltage supply hardware internally to convert at least certain voltages to higher levels for program and read. In one example, the main power supply provides multiple different voltage levels to the SSD, including different read voltage levels. Whether the voltage control is within the SSD or outside the SSD, or in a different implementation of the storage device, read logic 250 provides control over the transitioning of wordlines from a read voltage to ground.

In one example, read logic 250 triggers the N wordlines of memory array 210 to go to ground in order from WL[0] (the bottom-most wordline) to WL[N-1} (the top-most wordline). In one example, the order can be reversed, from WL[N-1] to WL[0]. In one example, read logic 250 first selects a middle wordline (i.e., between WL[0] and WL[N-1] to go to ground, and then cascades the grounding out to the top and bottom of the stack of wordlines (i.e., toward WL[N-1] and toward WL[0]). In one example, the middle wordline that is selected is a wordline halfway or approximately halfway between the top and bottom (around WL[N/2]).

In one example, read logic 250 selects a wordline that is a critical wordline to start the grounding sequence. A critical wordline can refer to a wordline that corresponds to a row of storage cells that has a higher sensitivity to temperature change than other wordlines in the 3D stack. In one example, there is more than one critical wordline, and the grounding sequence can focus on the critical wordlines, such as by starting at the wordlines between the critical wordlines, then grounding the critical wordlines, then grounding other wordlines above and below the critical wordlines to the top and bottom, respectively, of the stack. In one example, read logic 250 starts at multiple wordlines in the middle and propagates the grounding out from the selected wordlines. In one example, read logic 250 selects a group of wordlines.

Figure 2B:
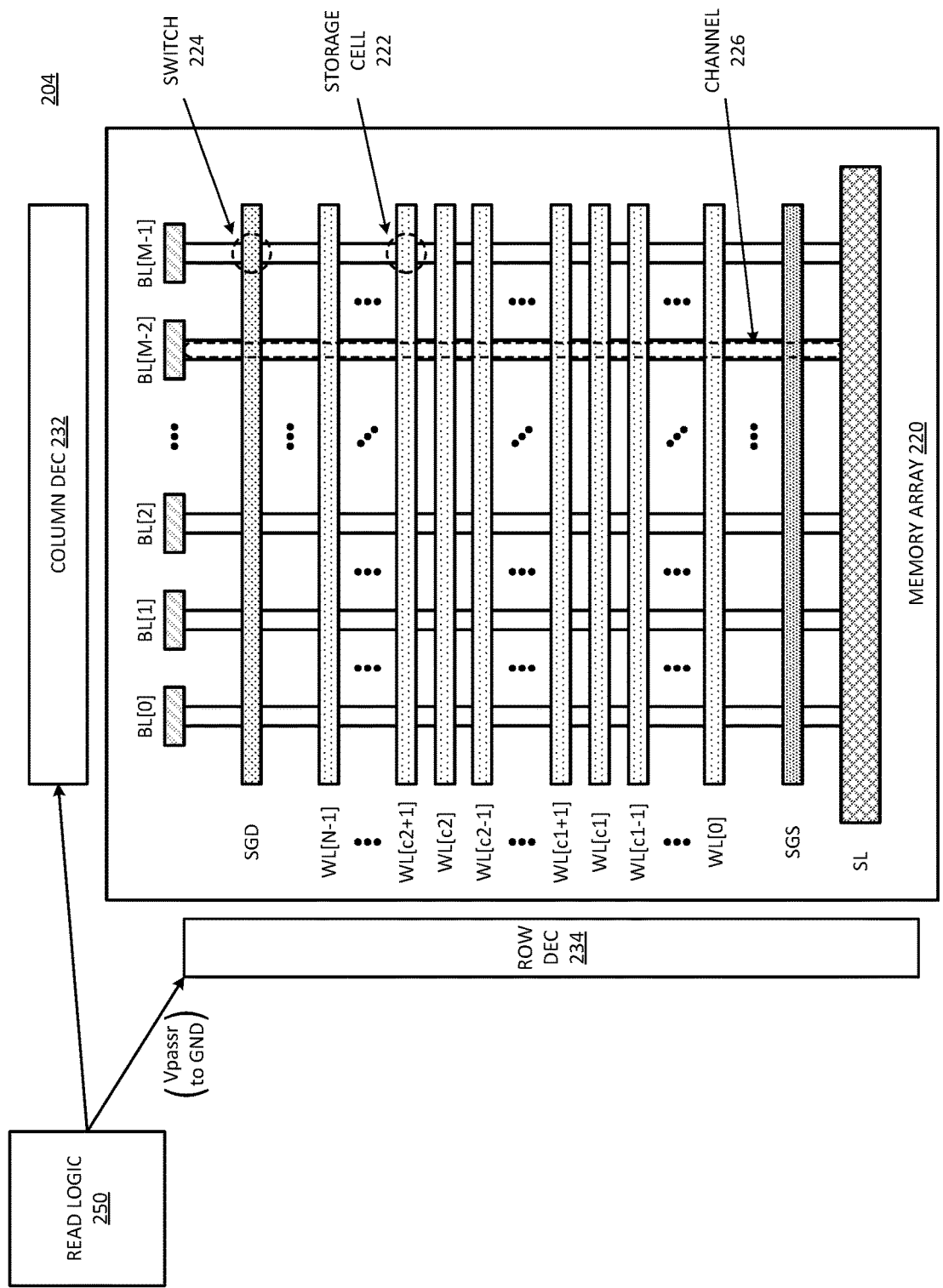
FIG. 2B is a block diagram of an example of a circuit structure for the system of FIG. 2A.

FIG. 2B is a block diagram of an example of a circuit structure for the system of FIG. 2A. System 204 provides an example structure to implement a system in accordance with system 202 of FIG. 2A. Whereas system 202 illustrates the circuit representation of the memory array, memory array 220 of system 204 illustrates a representation of aspects of the physical layout of the memory array.

Similar to system 202, system 204 includes the source layer (SL) common to all bitlines BL[0:M-1], select layers SGD and SGS, and wordlines WL[0:N-1]. WL[N-1] can be considered the "last" wordline in the stack in the sense of having the highest position or address of any wordline in the stack. Switch 224 is formed at an intersection of SGD and a bitline and at the intersection of SGS and a bitline.

As with system 202, system 204 includes column decode (DEC) 232 to selectively apply voltage to bitlines BL[0:M-1] and row decode (DEC) 234 to selectively apply voltage to wordlines WL[0:N-1]. Storage cells 222 represent NAND storage cells for a NAND device in accordance with system 204. The description above with respect to storage cell 212 of system 202 can apply to storage cell 222. The selective application of voltage to bitlines and wordlines can be in accordance with column and row address information, respectively, for an access operation. The decode circuitry can selectively enable the select gates to enable the vertical channels, illustrated by channel 226.

In one example, system 204 includes read logic 250 to control the grounding of wordlines after a read. In one example, read logic 250 can stagger the transition of selected wordlines from Vpassr to ground based on selectively transitioning the wordlines to ground in sequence. Channel 226 represents an electrical connection between the bitlines and the vertical stack of wordlines.

Channel 226 can experience read window budget degradation due to Vt shift due to charge traps at the grain boundaries of the polycrystalline channel material when wordlines are grounded simultaneously as traditionally done. These excess charges can get captured in the polysilicon (polySi) grain boundary traps. The trapped charges provide resistance to current conduction in the channel, causing the Vt to increase. The amount of Vt increase depends on the amount of trapped charges and can vary from cell-to-cell. Furthermore, a change in temperature can change the number of trapped charges, resulting in a Vt change. Changes in Vt can widen the Vt distribution when the temperature is different between read and write operations. The amount of trapped charges can also fluctuate between successive reads increasing read noise.

In system 204, the wordlines can be taken to ground successively, allowing the charges to discharge instead of remaining trapped in channel 226. Discharging the channel enables system 204 to maintain program steps size and maintain temperature range due to the enhanced read operation.

In one example, read logic 250 is programmed to know what wordlines are critical wordlines that are more susceptible to temperature changes. The programming can be provided by characterizing a 3D device and determining a sequence of wordline grounding that can result in improved discharge of the channel.

Figure 3:
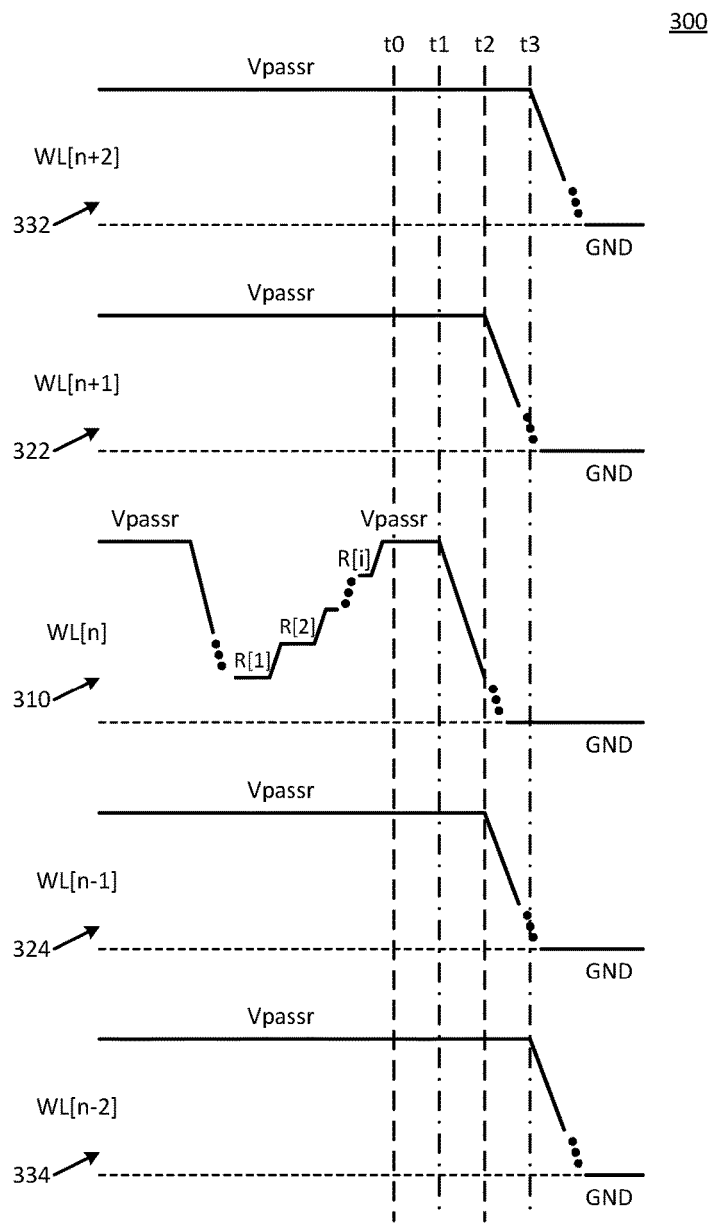
FIG. 3 is a signal diagram of an example of sequential transition from a pass voltage to ground from a middle wordline.

FIG. 3 is a signal diagram of an example of sequential transition from a pass voltage to ground from a middle wordline. System 300 provides a representation of a read operation. System 300 provides an example of voltage waveforms for wordlines in a vertical stack in accordance with an example of system 202 or system 204.

System 300 illustrates voltage curve 310 of WL[n], which is a middle wordline in the stack. A middle wordline here refers to a wordline that is not the top-most or bottom-most wordline in the stack. System 300 illustrates voltage curves 322 and 324 for WL[n+1] and WL[n-1], respectively, which are the adjacent wordlines of WL[n]. System 300 illustrates voltage curve 332 for WL[n+2], which is subsequent to WL[n+1], and voltage curve 334 for WL[n-2], which is subsequent to WL[n-1].

Consider a read operation for WL[n]. As illustrated, WL[n-2: n+2] are initially charged to a high voltage Vpassr for the read operation. Vpassr can be referred to as a high voltage bias, which enables current conduction through the channel for a cell with Vt lower than a specific read voltage. Vpassr can be referred to as a Vpass voltage for read.

The selected WL[n] is charged in sequence to different read voltages (R[1], R[2], . . . , R[i]) and then is brought again to Vpassr. The WL[n-2], WL[n-1], WL[n+1], and WL[n+2] remain at high voltage Vpassr while WL[n] goes through the read voltages.

The end of the read operation can be considered to be when WL[n] is returned to Vpassr, or the read operation can be considered to include grounding of the wordlines. Thus, in one example, after the read operation, WL[n] is taken to ground, and the other wordlines are taken to ground in sequence after WL[n]. The grounding of the wordlines can be referred to as a read recovery operation, recovery period, or read recovery phase.

The grounding of the wordlines after the read operation for system 300 proceeds in accordance with table 340. A controller controls the transitioning of the pass voltage to ground. As illustrated, at time t0, all wordlines are at Vpassr. After a time delay, at time t1, WL[n] is taken to ground (GND), while WL[n-2], WL[n-1], WL[n+1], and WL[n+2] remain at Vpassr. Thus, first a middle wordline, WL[n], goes to GND, while the other wordlines are at Vpassr.

While WL[n] is illustrated as the wordline being read for system 300, the description of staggering the wordline grounding can apply whether WL[n] is read or whether a different wordline is read. In one example, the system staggers grounding based on the wordline being read, such as first grounding the wordline that is the target of the read and staggering out from that wordline. In one example, the system staggers the grounding based on selected wordlines (e.g., critical wordlines or the highest address wordline), regardless of which wordline is read. In such an implementation, a wordline will be read, and then the system will perform recovery operations by triggering a pre-selected wordline to transition to ground, followed by other wordlines in sequence. Thus, in one example, the sequence of table 340 will be followed regardless of which wordline is read.

After a time delay, at time t2, the system triggers WL[n-1] and WL[n+1] to go to GND. After another time delay, at time t3, the system triggers WL[n-2] and WL[n+2] go to GND. Only wordlines WL[n-2: n+2] are illustrated. The stack of wordlines can include wordlines not shown. In such a case, the system can continue to trigger other wordlines to ground in sequence, or in combination with other wordlines illustrated.

In a fully programmed array, with traditional grounding, when the wordline voltage ($V_{WL}$) becomes lower than the highest Vt in the NAND array, Vtmax, the channel near the cells with Vtmax shuts off and stops the current flow from source to drain. Cells with Vt lower than Vtmax are left with excess charges in their channel. The lower the Vt, the more the excess charges.

By taking the wordlines to ground in sequence, high Vt cells cannot shut off the entire channel. As a result, when any wordline goes to ground, at least one side of the array remains conducting, allowing charges to move out from the channel near the wordline that goes to ground. In table 340, the grounding sequence is from the middle of stack to the ends of the stack. As an alternative to grounding wordlines sequentially from the middle of the array to both ends, the sequence can start from one side of the array and progress toward the other end. It will be understood that a sequence from one end to the other end will result in a longer read time. In one example, the controller triggers the wordlines to transition to ground in groups of wordlines.

Figure 4:
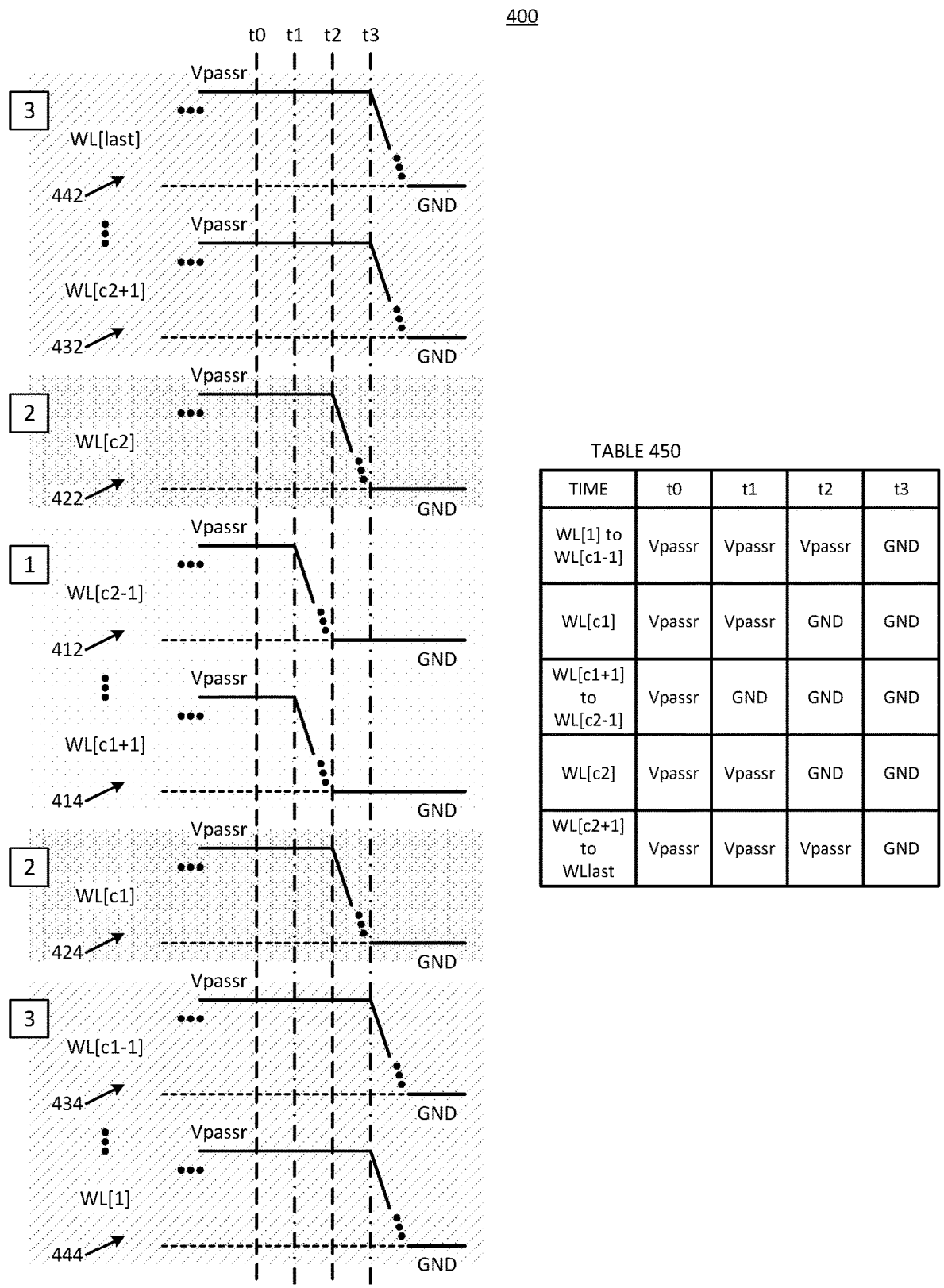
FIG. 4 is a signal diagram of an example of sequential transition from a pass voltage to ground from a critical wordlines.

FIG. 4 is a signal diagram of an example of sequential transition from a pass voltage to ground from a critical wordline. System 400 provides a representation of a read operation. System 400 provides an example of voltage waveforms for wordlines in a vertical stack in accordance with an example of system 202 or system 204. Whereas system 300 illustrates a ground transition sequence with wordlines triggered to ground individually, system 400 illustrates a sequence where wordlines are transitioned in groups.

System 400 illustrates voltage curve 422 for WL[c2] and voltage curve 424 for WL[c1], which are middle wordlines in the stack. Wordlines WL[c1] and WL[c2] represent critical wordlines, which are more susceptible to charge buildup in the channel. The cause for a wordline being a critical wordline can be associated with an architecture of the memory array.

System 400 does not illustrate which wordline is the wordline that was read. Rather, any wordline can be the wordline that was read, and the controller will sequence the transition of the wordlines to ground based on the architecture of the array rather than based on which wordline was selected for read.

System 400 illustrates voltage curve 412 for WL[c2-1] and voltage curve 414 for WL[c1+1], which are adjacent wordlines to WL[c2] and WL[c1], respectively. There can be zero or more wordlines between WL[c1+1] and WL[c2-1]. In one example, the wordlines WL[c1+1: c2-1] represent a group of wordlines that will be transitioned to ground together, as Group 1. System 400 illustrates voltage curve 432 for WL[c2+1], which is adjacent WL[c2], and voltage curve 442 for WL[last], which is a top wordline in the stack. System 400 illustrates voltage curve 434 for WL[c1-1], which is adjacent WL[c1], and voltage curve 444 for WL[1], which is a bottom-most wordline in the stack.

In one example, the wordlines WL[c1] and WL[c2] represent a group of wordlines that will be transitioned to ground together, as Group 2. In one example, the wordlines WL[1: c1-1] and WL[c2+1: last] represent a group of wordlines that will be transitioned to ground together, as Group 3.

Consider a read operation for a wordline in the stack, which is not specifically illustrated. As illustrated, after the application of at least one read voltage to the selected wordline, the wordlines of system 400 are at a pass voltage Vpassr. The grounding of the wordlines for system 400 proceeds in accordance with table 450. A controller controls the transitioning of the pass voltage to ground.

As illustrated, at time t0, all wordlines are at Vpassr. After a time delay, at time t1, wordlines WL[c1+1] to WL[c2-1] of Group 1 are taken to ground (GND), while the other wordlines remain at Vpassr. After a time delay, at time t2, the system triggers WL[c1] and WL[c2] of Group 2 to go to GND. After another time delay, at time t3, the system triggers WL[1] to WL[c1-1] and WL[c2+1] to WL[last] of Group 3 go to GND. It will be understood that more groups can be used. In one example, the sequence could initiate with a critical wordline, progress to wordlines with proximity to that critical wordline, then transition another critical wordline, and continue out to the ends.

As illustrated, the controller can be programmed to execute a grounding sequence customized to address known or suspected regions of the channel with RWB issues, or otherwise transition the wordlines in groups of one or more wordlines.

Figure 5:
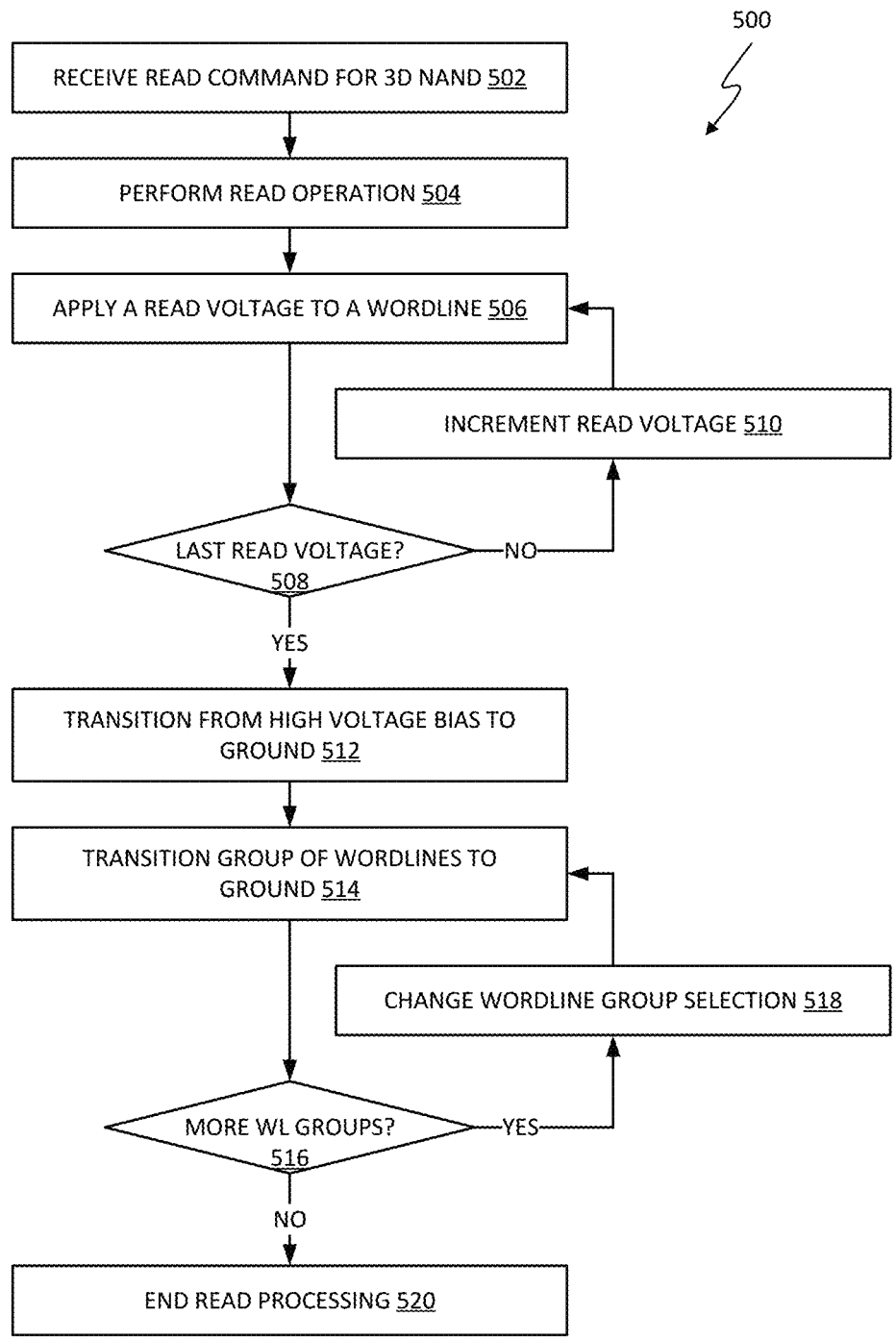
FIG. 5 is a flow diagram of an example of a process for sequentially transitioning wordlines of a 3D NAND array from a pass voltage to ground.

FIG. 5 is a flow diagram of an example of a process for sequentially transitioning wordlines of a 3D NAND array from a pass voltage to ground. Process 500 represents a process for a NAND read with sequential wordline grounding. Such a process can be implemented by a controller for a system in accordance with an example of system 100, system 202, system 204, system 300, or system 400.

The controller can receive a read command for the 3D NAND array, at 502. In response to the read command, the controller generates commands or control signals to perform the read operation, at 504. The read operation can include the application of various read voltages and a pass voltage.

The controller can apply a pass voltage to non-selected wordlines, and apply a read voltage to a selected wordline, at 506. If the read voltage is not the last to be applied, at 508 NO branch, the controller can increment the read voltage, at 510, and apply the incremented read voltage to the selected wordline while maintaining the other wordlines at the pass voltage, at 506. If the read voltage is the last to be read, at 508 YES branch, the controller can transition the wordlines from the pass voltage to ground, at 512.

The controller can transition the wordlines as groups of wordlines, where a group includes one or more wordlines triggered in parallel. In one example, the controller transitions a group of wordlines to ground, at 514. If there are more wordlines or wordline groups to transition to ground, at 516 YES branch, the controller can change the wordline group selection, at 518. The selection of a group can include generating a control signal to stop applying the pass voltage to the wordlines of the group, and grounding them.

The controller can then transition the next group of wordlines to ground, at 514. After there are no more wordline groups to be transitioned to ground, at 516 NO branch, the controller can end the read processing, at 520.

Figure 6A:
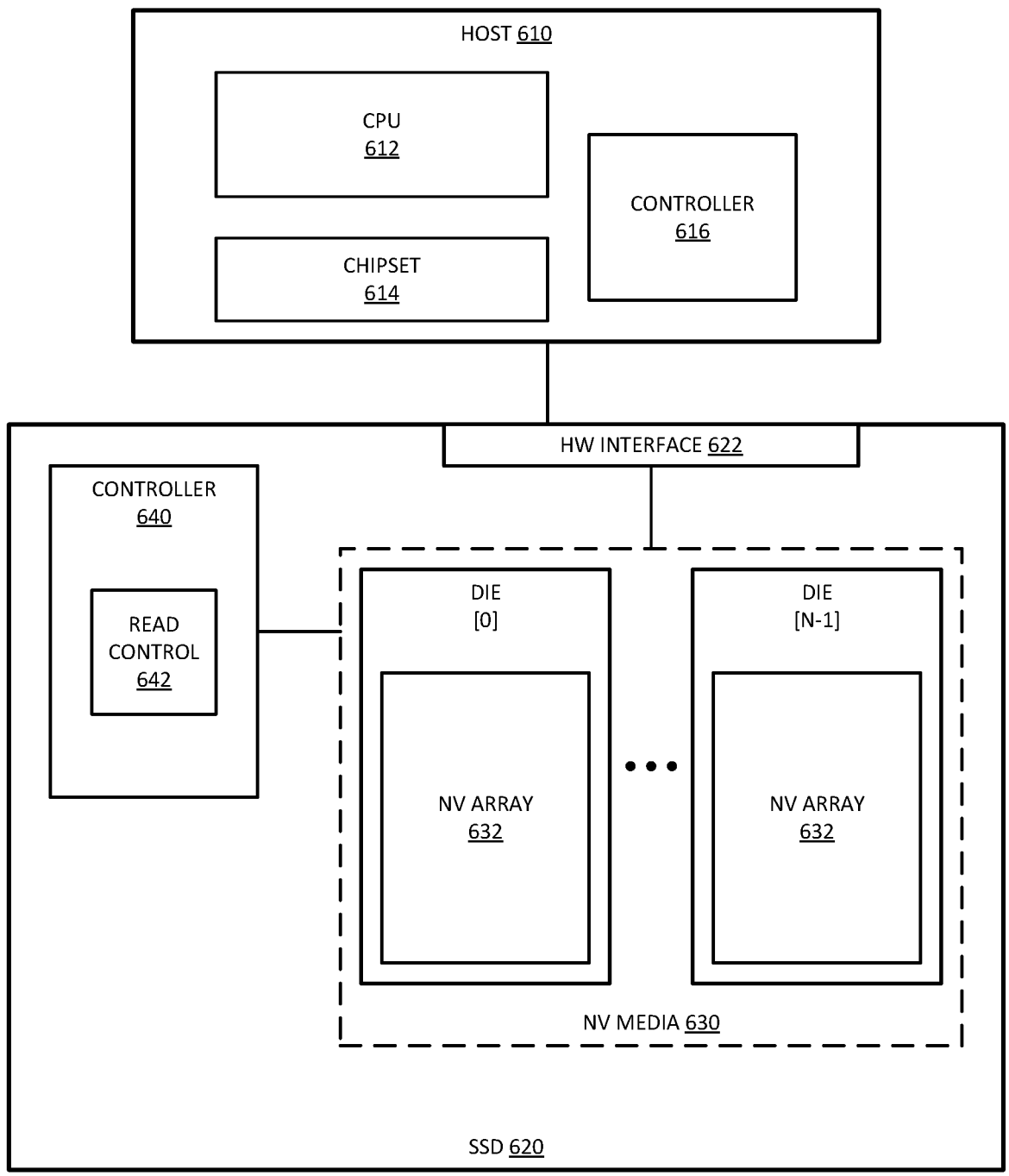
FIG. 6A is a block diagram of an example of a system with a solid state drive (SSD) with logic to sequentially transition wordlines of a 3D NAND array from a pass voltage to ground.

FIG. 6A is a block diagram of an example of a system with a solid state drive (SSD) with logic to sequentially transition wordlines of a 3D NAND array from a pass voltage to ground. System 602 represents components of a 3D NAND storage system that performs a read with staggered wordline grounding in accordance with an example of system 100, system 202, system 204, system 300, or system 400.

System 602 includes SSD 620 coupled with host 610. Host 610 represents a host hardware platform that connects to SSD 620. Host 610 includes CPU (central processing unit) 612 or other processor as a host processor or host processor device. CPU 612 represents any host processor that generates requests to access data stored on SSD 620, either to read the data or to write data to the storage. Such a processor can include a single or multicore processor, a primary processor for a computing device, a graphics processor, a peripheral processor, or a supplemental or auxiliary processor, or a combination. CPU 612 can execute a host OS and other applications to cause the operation of system 602.

Host 610 includes chipset 614, which represents hardware components that can be included in connecting between CPU 612 and SSD 620. For example, chipset 614 can include interconnect circuits and logic to enable access to SSD 620. Thus, host 610 can include a hardware platform drive interconnect to couple SSD 620 to host 610. Host 610 includes hardware to interconnect to the SSD. Likewise, SSD 620 includes corresponding hardware to interconnect to host 610.

Host 610 includes controller 616, which represents a storage controller or memory controller on the host side to control access to SSD 620. In one example, controller 616 is included in chipset 614. In one example, controller 616 is included in CPU 612. Controller 616 can be referred to as an NV memory controller to enable host 610 to schedule and organize commands to SSD 620 to read and write data.

SSD 620 represents a solid-state drive or other storage system or module that includes nonvolatile (NV) media 630 to store data. NV media 630 can be, for example, a 3D NAND array. SSD 620 includes HW (hardware) interface 622, which represents hardware components to interface with host 610. For example, HW interface 622 can interface with one or more buses to implement a high speed interface standard such as NVMe (nonvolatile memory express) or PCIe (peripheral component interconnect express).

In one example, NV media 630 is implemented as multiple dies, illustrated as N dies, Die[0:{N-1}]. N can be any number of devices, and is often a binary number. SSD 620 includes controller 640 to control access to NV media 630. Controller 640 represents hardware and control logic within SSD 620 to execute control over the media. Controller 640 is internal to the nonvolatile storage device or module, and is separate from controller 616 of host 610.

The NV dies of NV media 630 include 3D NV array 632, which is a three-dimensional array of storage cells based on the NV media. In one example, controller 640 includes read control 642 to implement a staggered or a sequential transitioning of wordlines of NV array 632 to ground. Thus, rather than grounding all wordlines of NV array 632 after a read of a selected wordline, read control 642 transitions the wordlines to ground individually or in groups, with a time delay between the ground transitions.

Figure 6B:
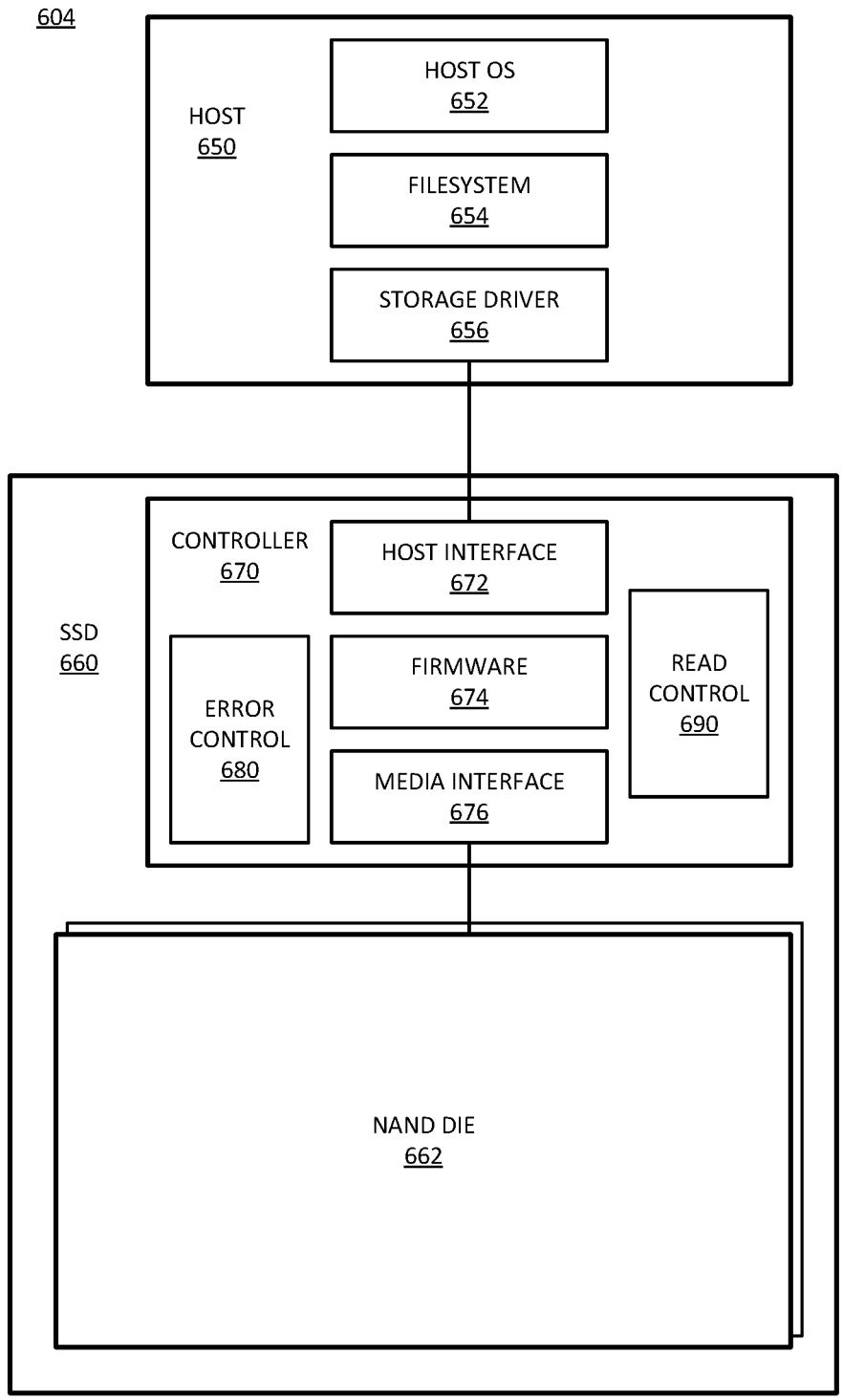
FIG. 6B is a block diagram of an example of a system with a solid state drive (SSD) with a media controller to sequentially transition wordlines of a 3D NAND array from a pass voltage to ground.

FIG. 6B is a block diagram of an example of a system with a solid state drive (SSD) with a media controller to sequentially transition wordlines of a 3D NAND array from a pass voltage to ground. System 604 provides one example of a system in accordance with system 602 of FIG. 6A. System 604 illustrates the logical layers of the host and SSD of a hardware platform in accordance with system 602. System 604 can represent software and firmware components of an example of system 602, as well as physical components. In one example, host 650 provides one example of host 610. In one example, SSD 660 provides one example of SSD 620.

In one example, host 650 includes host OS 652, which represents a host operating system or software platform for the host. Host OS 652 can include a platform on which applications, services, agents, and/or other software executes, and is executed by a processor. Filesystem 654 represents control logic for controlling access to the NV media. Filesystem 654 can manage what addresses or memory locations are used to store what data. There are numerous filesystems known, and filesystem 654 can implement known filesystems or other proprietary systems. In one example, filesystem 654 is part of host OS 652.

Storage driver 656 represents one or more system-level modules that control the hardware of host 650. In one example, drivers 656 include a software application to control the interface to SSD 660, and thus control the hardware of SSD 660. Storage driver 656 can provide a communication interface between the host and the SSD.

Controller 670 of SSD 660 includes firmware 674, which represents control software/firmware for the controller. In one example, controller 670 includes host interface 672, which represents an interface to host 650. In one example, controller 670 includes media interface 676, which represents an interface to NAND die 662. NAND die 662 represents a specific example of NV media, and includes an associated 3D NAND array.

Media interface 676 represent control that is executed on hardware of controller 670. It will be understood that controller 670 includes hardware to interface with host 650, which can be considered to be controlled by host interface software/firmware 674. Likewise, it will be understood that controller 670 includes hardware to interface with NAND die 662. In one example, code for host interface 672 can be part of firmware 674. In one example, code for media interface 676 can be part of firmware 674.

In one example, controller 670 includes error control 680 to handle data errors in accessed data, and corner cases in terms of compliance with signaling and communication interfacing. Error control 680 can include implementations in hardware or firmware, or a combination of hardware and software.

In one example, controller 670 includes read control 690 to implement a staggered or a sequential transitioning of wordlines of NAND die 662 to ground. Thus, rather than grounding all wordlines of the 3D NAND after a read of a selected wordline, read control 690 transitions the wordlines to ground individually or in groups, with a time delay between the ground transitions.

Figure 7:
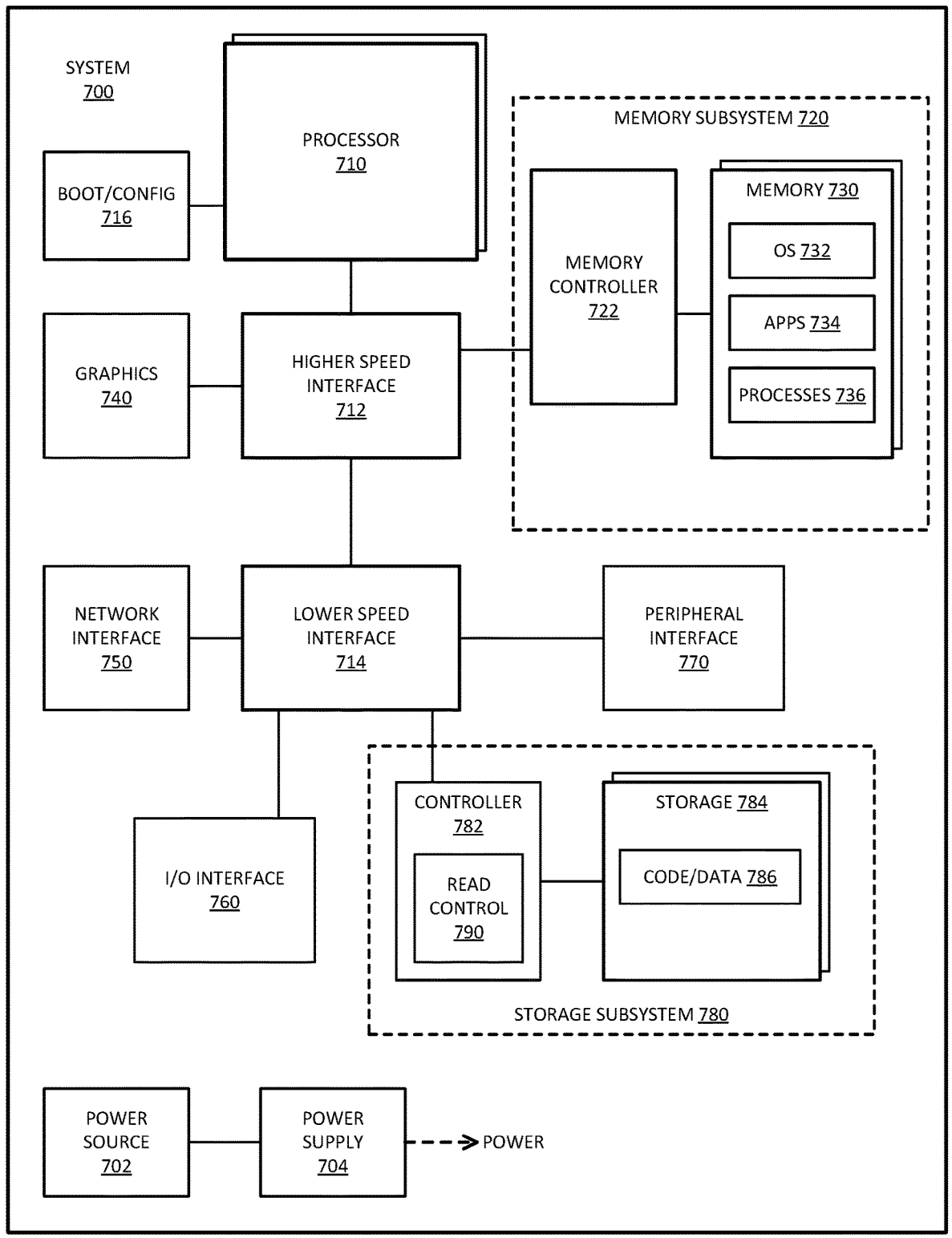
FIG. 7 is a block diagram of an example of a computing system in which sequential transitioning of wordlines of a 3D NAND array from a pass voltage to ground can be implemented.

FIG. 7 is a block diagram of an example of a computing system in which sequential transitioning of wordlines of a 3D NAND array from a pass voltage to ground can be implemented. System 700 represents a computing device in accordance with any example herein, and can be a laptop computer, a desktop computer, a tablet computer, a server, a gaming or entertainment control system, embedded computing device, or other electronic device.

System 700 represents a system in accordance with an example of system 100. In one example, system 700 includes storage subsystem 780 with storage 784 implemented as a 3D NAND array. The 3D NAND array includes a stack of wordlines. In one example, controller 782 includes read control 790 to implement a staggered or a sequential transitioning of wordlines of the 3D NAND array to ground. Thus, rather than grounding all wordlines of storage 784 after a read of a selected wordline, read control 790 transitions the wordlines to ground individually or in groups, with a time delay between the ground transitions.

System 700 includes processor 710 can include any type of microprocessor, central processing unit (CPU), graphics processing unit (GPU), processing core, or other processing hardware, or a combination, to provide processing or execution of instructions for system 700. Processor 710 can be a host processor device. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or a combination of such devices.

System 700 includes boot/config 716, which represents storage to store boot code (e.g., basic input/output system (BIOS)), configuration settings, security hardware (e.g., trusted platform module (TPM)), or other system level hardware that operates outside of a host OS. Boot/config 716 can include a nonvolatile storage device, such as read-only memory (ROM), flash memory, or other memory devices.

In one example, system 700 includes interface 712 coupled to processor 710, which can represent a higher speed interface or a high throughput interface for system components that need higher bandwidth connections, such as memory subsystem 720 or graphics interface components 740. Interface 712 represents an interface circuit, which can be a standalone component or integrated onto a processor die. Interface 712 can be integrated as a circuit onto the processor die or integrated as a component on a system on a chip. Where present, graphics interface 740 interfaces to graphics components for providing a visual display to a user of system 700. Graphics interface 740 can be a standalone component or integrated onto the processor die or system on a chip. In one example, graphics interface 740 can drive a high definition (HD) display or ultra high definition (UHD) display that provides an output to a user. In one example, the display can include a touchscreen display. In one example, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more memory devices 730 such as read-only memory (ROM), flash memory, one or more varieties of random-access memory (RAM) such as DRAM, 3DXP (three-dimensional crosspoint), or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710, such as integrated onto the processor die or a system on a chip.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 700 includes interface 714, which can be coupled to interface 712. Interface 714 can be a lower speed interface than interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, 3DXP, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one example, storage subsystem 780 includes controller 782 to interface with storage 784. In one example controller 782 is a physical part of interface 714 or processor 710, or can include circuits or logic in both processor 710 and interface 714.

Power source 702 provides power to the components of system 700. More specifically, power source 702 typically interfaces to one or multiple power supplies 704 in system 700 to provide power to the components of system 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 or power supply 704 includes wireless charging hardware to charge via proximity to a charging field. In one example, power source 702 can include an internal battery or fuel cell source.

Figure 8:
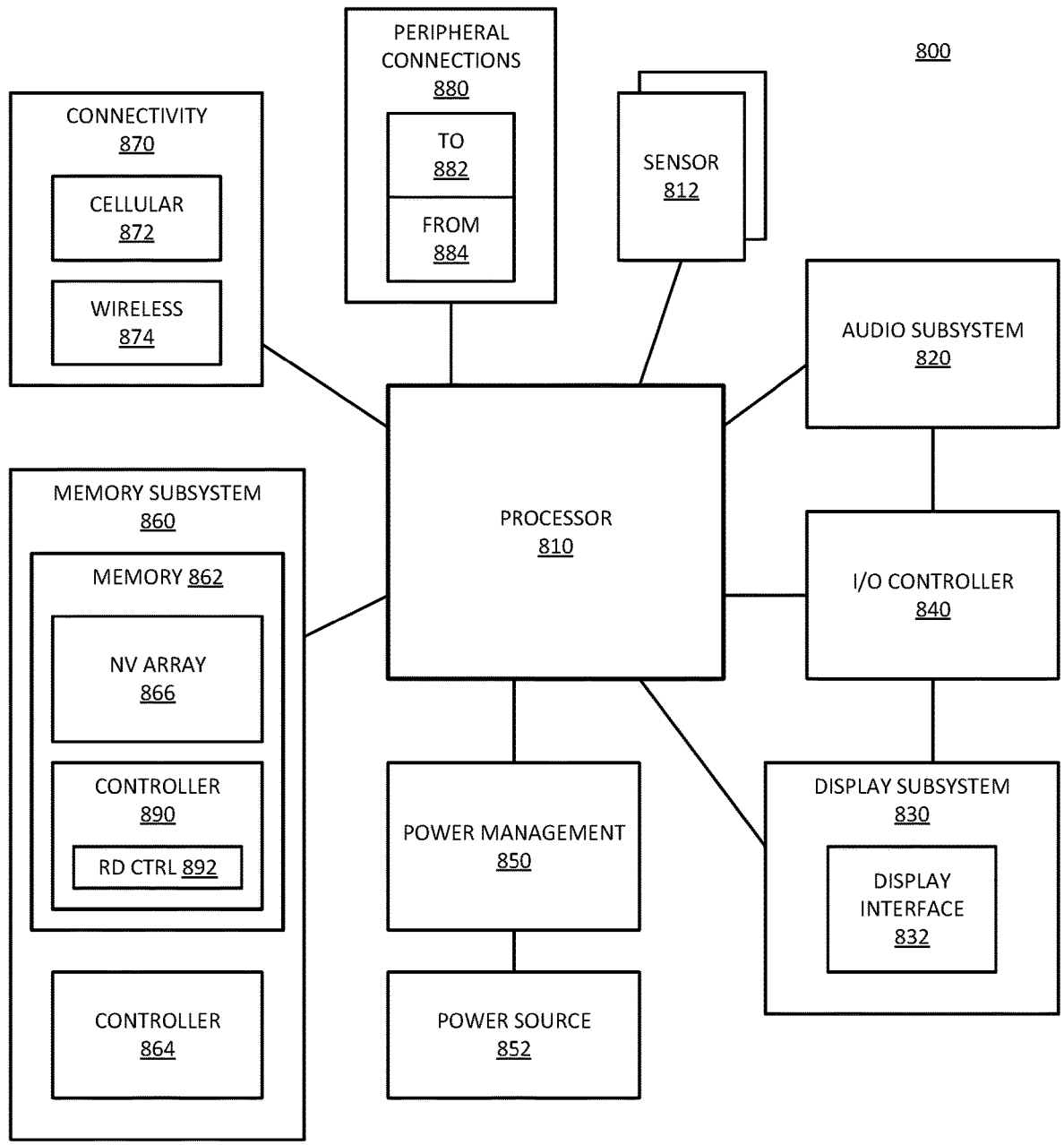
FIG. 8 is a block diagram of an example of a mobile device in which sequential transitioning of wordlines of a 3D NAND array from a pass voltage to ground can be implemented.

FIG. 8 is a block diagram of an example of a mobile device in which sequential transitioning of wordlines of a 3D NAND array from a pass voltage to ground can be implemented. System 800 represents a mobile computing device, such as a computing tablet, a mobile phone or smartphone, wearable computing device, or other mobile device, or an embedded computing device. It will be understood that certain of the components are shown generally, and not all components of such a device are shown in system 800.

System 800 represents a system in accordance with an example of system 100. In one example, system 800 includes memory subsystem 860 with memory 862. At least a portion of memory 862 can be implemented as a 3D NAND array, represented by NV array 866. Controller 890 represents an on-storage controller to manage the read access to NV array 866. In one example, controller 890 is part of controller 864. The 3D NAND array includes a stack of wordlines. In one example, controller 890 includes read control (RD CTRL) 892 to implement a staggered or a sequential transitioning of wordlines of the 3D NAND array to ground. Thus, rather than grounding all wordlines of NV array 866 after a read of a selected wordline, read control 892 transitions the wordlines to ground individually or in groups, with a time delay between the ground transitions.

System 800 includes processor 810, which performs the primary processing operations of system 800. Processor 810 can be a host processor device. Processor 810 can include one or more physical devices, such as microprocessors, application processors, microcontrollers, programmable logic devices, or other processing means. The processing operations performed by processor 810 include the execution of an operating platform or operating system on which applications and device functions are executed. The processing operations include operations related to I/O (input/output) with a human user or with other devices, operations related to power management, operations related to connecting system 800 to another device, or a combination. The processing operations can also include operations related to audio I/O, display I/O, or other interfacing, or a combination. Processor 810 can execute data stored in memory. Processor 810 can write or edit data stored in memory.

In one example, system 800 includes one or more sensors 812. Sensors 812 represent embedded sensors or interfaces to external sensors, or a combination. Sensors 812 enable system 800 to monitor or detect one or more conditions of an environment or a device in which system 800 is implemented. Sensors 812 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 812 can also include sensors for biometric systems such as fingerprint recognition systems, face detection or recognition systems, or other systems that detect or recognize user features. Sensors 812 should be understood broadly, and not limiting on the many different types of sensors that could be implemented with system 800. In one example, one or more sensors 812 couples to processor 810 via a frontend circuit integrated with processor 810. In one example, one or more sensors 812 couples to processor 810 via another component of system 800.

In one example, system 800 includes audio subsystem 820, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 800, or connected to system 800. In one example, a user interacts with system 800 by providing audio commands that are received and processed by processor 810.

Display subsystem 830 represents hardware (e.g., display devices) and software components (e.g., drivers) that provide a visual display for presentation to a user. In one example, the display includes tactile components or touchscreen elements for a user to interact with the computing device. Display subsystem 830 includes display interface 832, which includes the particular screen or hardware device used to provide a display to a user. In one example, display interface 832 includes logic separate from processor 810 (such as a graphics processor) to perform at least some processing related to the display. In one example, display subsystem 830 includes a touchscreen device that provides both output and input to a user. In one example, display subsystem 830 includes a high definition (HD) or ultra-high definition (UHD) display that provides an output to a user. In one example, display subsystem includes or drives a touchscreen display. In one example, display subsystem 830 generates display information based on data stored in memory or based on operations executed by processor 810 or both.

I/O controller 840 represents hardware devices and software components related to interaction with a user. I/O controller 840 can operate to manage hardware that is part of audio subsystem 820, or display subsystem 830, or both. Additionally, I/O controller 840 illustrates a connection point for additional devices that connect to system 800 through which a user might interact with the system. For example, devices that can be attached to system 800 might include microphone devices, speaker or stereo systems, video systems or other display device, keyboard or keypad devices, buttons/switches, or other I/O devices for use with specific applications such as card readers or other devices.

As mentioned above, I/O controller 840 can interact with audio subsystem 820 or display subsystem 830 or both. For example, input through a microphone or other audio device can provide input or commands for one or more applications or functions of system 800. Additionally, audio output can be provided instead of or in addition to display output. In another example, if display subsystem includes a touchscreen, the display device also acts as an input device, which can be at least partially managed by I/O controller 840. There can also be additional buttons or switches on system 800 to provide I/O functions managed by I/O controller 840.

In one example, I/O controller 840 manages devices such as accelerometers, cameras, light sensors or other environmental sensors, gyroscopes, global positioning system (GPS), or other hardware that can be included in system 800, or sensors 812. The input can be part of direct user interaction, as well as providing environmental input to the system to influence its operations (such as filtering for noise, adjusting displays for brightness detection, applying a flash for a camera, or other features).

In one example, system 800 includes power management 850 that manages battery power usage, charging of the battery, and features related to power saving operation. Power management 850 manages power from power source 852, which provides power to the components of system 800. In one example, power source 852 includes an AC to DC (alternating current to direct current) adapter to plug into a wall outlet. Such AC power can be renewable energy (e.g., solar power, motion based power). In one example, power source 852 includes only DC power, which can be provided by a DC power source, such as an external AC to DC converter. In one example, power source 852 includes wireless charging hardware to charge via proximity to a charging field. In one example, power source 852 can include an internal battery or fuel cell source.

Memory subsystem 860 includes memory device(s) 862 for storing information in system 800. Memory subsystem 860 can include nonvolatile (state does not change if power to the memory device is interrupted) or volatile (state is indeterminate if power to the memory device is interrupted) memory devices, or a combination. Memory 860 can store application data, user data, music, photos, documents, or other data, as well as system data (whether long-term or temporary) related to the execution of the applications and functions of system 800. In one example, memory subsystem 860 includes memory controller 864 (which could also be considered part of the control of system 800, and could potentially be considered part of processor 810). Memory controller 864 includes a scheduler to generate and issue commands to control access to memory device 862.

Connectivity 870 includes hardware devices (e.g., wireless or wired connectors and communication hardware, or a combination of wired and wireless hardware) and software components (e.g., drivers, protocol stacks) to enable system 800 to communicate with external devices. The external device could be separate devices, such as other computing devices, wireless access points or base stations, as well as peripherals such as headsets, printers, or other devices. In one example, system 800 exchanges data with an external device for storage in memory or for display on a display device. The exchanged data can include data to be stored in memory, or data already stored in memory, to read, write, or edit data.

Connectivity 870 can include multiple different types of connectivity. To generalize, system 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 874 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that system 800 could both be a peripheral device ("to" 882) to other computing devices, as well as have peripheral devices ("from" 884) connected to it. System 800 commonly has a "docking" connector to connect to other computing devices for purposes such as managing (e.g., downloading, uploading, changing, synchronizing) content on system 800. Additionally, a docking connector can allow system 800 to connect to certain peripherals that allow system 800 to control content output, for example, to audiovisual or other systems.

In addition to a proprietary docking connector or other proprietary connection hardware, system 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a method for reading a NAND device includes: reading a 3D (three dimensional) NAND device having a 3D stack with multiple wordlines vertically stacked, including setting the multiple wordlines to a read bias voltage, wherein the multiple wordlines include a bottom-most wordline, a top-most wordline, and middle wordlines between the bottom-most wordline and the top-most wordline; transitioning a selected wordline of the multiple wordlines from the read bias voltage to ground; delaying a transitioning of the other wordlines from the read bias voltage to ground; and transitioning the other wordlines from the read bias voltage to ground after delaying.

In an example of the method, in one example, the selected wordline comprises either the bottom-most wordline or the top-most wordline. In accordance with any preceding example of the method, in one example, the selected wordline comprises a selected middle wordline. In accordance with any preceding example of the method, in one example, the selected middle wordline comprises a wordline halfway between the bottom-most wordline and the top-most wordline. In accordance with any preceding example of the method, in one example, the selected middle wordline comprises a critical wordline having a higher sensitivity to temperature change than other wordlines in the 3D stack. In accordance with any preceding example of the method, in one example, the selected middle wordline comprises a wordline selected for read. In accordance with any preceding example of the method, in one example, the selected wordline comprises one of multiple selected wordlines. In accordance with any preceding example of the method, in one example, the multiple selected wordlines comprise wordlines between two critical wordlines that have a higher sensitivity to temperature change than other wordlines in the 3D stack. In accordance with any preceding example of the method, in one example, transitioning the selected wordline from a pass voltage to ground comprises transitioning the selected wordline from the pass voltage Vpassr to ground. In accordance with any preceding example of the method, in one example, delaying the transitioning of the other wordlines, and then transitioning the other wordlines from the read bias voltage to ground after delaying comprises transitioning the other wordlines in groups of wordlines, with a transition delay between the transitioning of different groups of wordlines.

In general with respect to the descriptions herein, in one example a computer-readable storage medium includes instructions stored thereon, which when executed by a processor cause the processor to execute a method in accordance with any example of the preceding two paragraphs.

In general with respect to the descriptions herein, in one example a NAND storage device includes: a 3D (three dimensional) NAND array having a 3D stack with multiple wordlines vertically stacked, including a bottom-most wordline, a top-most wordline, and middle wordlines between the bottom-most wordline and the top-most wordline; and a controller to read the 3D NAND array, including to set the multiple wordlines to a read bias voltage, transition a selected wordline of the multiple wordlines from the read bias voltage to ground, delay a transitioning of the other wordlines from the read bias voltage to ground, and transition the other wordlines from the read bias voltage to ground after a delay.

In an example of the NAND storage device, in one example, the selected wordline comprises either the bottom-most wordline or the top-most wordline. In accordance with any preceding example of the NAND storage device, in one example, the selected wordline comprises a selected middle wordline. In accordance with any preceding example of the NAND storage device, in one example, the selected middle wordline comprises a wordline halfway between the bottom-most wordline and the top-most wordline. In accordance with any preceding example of the NAND storage device, in one example, the selected middle wordline comprises a critical wordline having a higher sensitivity to temperature change than other wordlines in the 3D stack. In accordance with any preceding example of the NAND storage device, in one example, the selected wordline comprises one of multiple selected wordlines. In accordance with any preceding example of the NAND storage device, in one example, the multiple selected wordlines comprise wordlines between two critical wordlines that have a higher sensitivity to temperature change than other wordlines in the 3D stack. In accordance with any preceding example of the NAND storage device, in one example, the controller is to transition the selected wordline from a pass voltage Vpassr to ground. In accordance with any preceding example of the NAND storage device, in one example, the controller is to transition the other wordlines in groups of wordlines, with a transition delay between the transitioning of different groups of wordlines. In accordance with any preceding example of the NAND storage device, in one example, the NAND storage device comprises a solid state driver (SSD).

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for reading a NAND device, comprising:
   reading a 3D (three dimensional) NAND device having a 3D stack with multiple wordlines vertically stacked, including setting the multiple wordlines to a high voltage bias, wherein the multiple wordlines include a bottom-most wordline, a top-most wordline, and middle wordlines between the bottom-most wordline and the top-most wordline;
   transitioning a selected wordline of the multiple wordlines from the high voltage bias to ground, wherein the selected wordline is a selected middle wordline of the middle wordlines, the selected middle wordline being a critical wordline having a higher sensitivity to temperature change than other wordlines in the 3D stack;
   delaying a transitioning of other wordlines of the multiple wordlines from the high voltage bias to ground relative to the transitioning of the selected wordline of the multiple wordlines from the high voltage bias to ground; and
   transitioning the other wordlines from the high voltage bias to ground after the delaying.

2. The method of claim 1, wherein the selected wordline comprises either the bottom-most wordline or the top-most wordline.

3. The method of claim 1, wherein the selected middle wordline comprises a wordline halfway between the bottom-most wordline and the top-most wordline.

4. The method of claim 1, wherein the selected middle wordline comprises a wordline selected for read.

5. The method of claim 1, wherein the selected wordline is one among a plurality of selected wordlines.

6. The method of claim 5, wherein the plurality of selected wordlines comprise wordlines between two critical wordlines that have a higher sensitivity to temperature change than other wordlines in the 3D stack.

7. The method of claim 1, wherein transitioning the selected wordline from the high voltage bias to ground comprises transitioning the selected wordline from a pass voltage Vpassr to ground.

8. The method of claim 1, wherein delaying the transitioning of the other wordlines, and transitioning the other wordlines from the high voltage bias to ground after the delaying comprises transitioning the other wordlines in groups of wordlines, with a transition delay between the transitioning of different groups of wordlines.

9. A NAND storage device, comprising:
   a 3D (three dimensional) NAND array having a 3D stack with multiple wordlines vertically stacked, including a bottom-most wordline, a top-most wordline, and middle wordlines between the bottom-most wordline and the top-most wordline; and
   a controller to read the 3D NAND array, including to set the multiple wordlines to a high voltage bias, transition a selected wordline of the multiple wordlines from the high voltage bias to ground, delay a transitioning of other wordlines of the multiple wordlines from the high voltage bias to ground relative to the transition of the selected wordline of the multiple wordlines from the high voltage bias to ground, and transition the other wordlines from the high voltage bias to ground after the delay, wherein the selected wordline is a selected middle wordline of the middle wordlines, the selected middle wordline being a critical wordline having a higher sensitivity to temperature change than other wordlines in the 3D stack.

10. The NAND storage device of claim 9, wherein the selected wordline comprises either the bottom-most wordline or the top-most wordline.

11. The NAND storage device of claim 9, wherein the selected middle wordline comprises a wordline halfway between the bottom-most wordline and the top-most wordline.

12. The NAND storage device of claim 9, wherein the selected wordline is one among a plurality of selected wordlines.

13. The NAND storage device of claim 12, wherein the plurality of selected wordlines comprise wordlines between two critical wordlines that have a higher sensitivity to temperature change than other wordlines in the 3D stack.

14. The NAND storage device of claim 9, wherein the controller is to transition the selected wordline from a pass voltage Vpassr to ground.

15. The NAND storage device of claim 9, wherein the controller is to transition the other wordlines in groups of wordlines, with a transition delay between the transitioning of different groups of wordlines.

16. The NAND storage device of claim 9, wherein the NAND storage device comprises a solid state driver (SSD).

* * * * *